(12) United States Patent
King

(10) Patent No.: US 6,664,601 B1
(45) Date of Patent: Dec. 16, 2003

(54) METHOD OF ORPERATING A DUAL MODE FET & LOGIC CIRCUIT HAVING NEGATIVE DIFFERENTIAL RESISTANCE MODE

(75) Inventor: Tsu-Jae King, Fremont, CA (US)

(73) Assignee: Progressant Technologies, Inc., Fremont, CA (US)

( * ) Notice: Subject to any disclaimer, the term of this patent is extended or adjusted under 35 U.S.C. 154(b) by 0 days.

(21) Appl. No.: 10/298,726

(22) Filed: Nov. 18, 2002

Related U.S. Application Data

(60) Division of application No. 10/028,394, filed on Dec. 21, 2001, now Pat. No. 6,518,589, which is a continuation-in-part of application No. 09/603,101, filed on Jun. 22, 2000, now Pat. No. 6,512,274, and a continuation-in-part of application No. 09/603,102, filed on Jun. 22, 2000, now Pat. No. 6,479,862, and a continuation-in-part of application No. 09/602,658, filed on Jun. 22, 2000, now abandoned.

(51) Int. Cl.$^7$ ............................................. H01L 29/72
(52) U.S. Cl. ................. 257/369; 257/107; 257/133; 257/295; 257/401; 257/402; 257/403; 257/421
(58) Field of Search ................. 257/369, 107, 257/133, 295, 401, 402, 403, 421

(56) References Cited

U.S. PATENT DOCUMENTS

| | | |
|---|---|---|
| 3,588,736 A | 6/1971 | McGroddy |
| 4,047,974 A | 9/1977 | Harari |
| 4,143,393 A | 3/1979 | DiMaria et al. |
| 4,806,998 A | 2/1989 | Vinter et al. |
| 4,945,393 A | 7/1990 | Beltram et al. |
| 5,021,841 A | 6/1991 | Leburton et al. |
| 5,032,891 A | 7/1991 | Takagi et al. |
| 5,093,699 A | 3/1992 | Weichold et al. |
| 5,130,763 A | 7/1992 | Delhaye et al. |
| 5,162,880 A | 11/1992 | Hazama et al. |
| 5,189,499 A | 2/1993 | Izumi et al. |
| 5,357,134 A | 10/1994 | Shimoji |
| 5,390,145 A | 2/1995 | Nakasha et al. |
| 5,477,169 A | 12/1995 | Shen et al. |
| 5,543,652 A | 8/1996 | Ikeda et al. |
| 5,606,177 A | 2/1997 | Wallace et al. |
| 5,633,178 A * | 5/1997 | Kalnitsky ................... 257/295 |
| 5,689,458 A | 11/1997 | Kuriyama |
| 5,698,997 A | 12/1997 | Williamson, III et al. |
| 5,705,827 A | 1/1998 | Baba et al. |
| 5,770,958 A | 6/1998 | Arai et al. |
| 5,773,996 A | 6/1998 | Takao |

(List continued on next page.)

FOREIGN PATENT DOCUMENTS

| | | |
|---|---|---|
| EP | 1085656 A2 | 3/2001 |
| EP | 1107317 A1 | 6/2001 |
| EP | 0526897 B1 | 11/2001 |
| WO | WO 9963595 | 4/1999 |
| WO | WO 0041309 | 7/2000 |

OTHER PUBLICATIONS

Alejandro F. Gonzalez, et al., "Standard CMOS Implementation of a Multiple–Valued Logic Signed–Digit Addr Based on Negative Differential–Resistance Devices," Proceedings of the 30th IEEE International Symposium on Multiple–Valued Logic (ISMVL 2000), 6 pages.

(List continued on next page.)

*Primary Examiner*—Edward Wojciechowicz
(74) *Attorney, Agent, or Firm*—J. Nicholas Gross

(57) ABSTRACT

A process for operating a dual mode FET and a logic circuit to include a negative differential resistance (NDR) characteristic is disclosed. In a FET embodiment, an NDR characteristic is selectively enabled/disabled by biasing a body contact, thus permitting a dual behavior of the device. Larger collections of such FETs can be synthesized to form dual mode logic circuits as well, so that a single circuit can perform more than one logic operation depending on whether an NDR mode is enabled or not.

23 Claims, 7 Drawing Sheets

U.S. PATENT DOCUMENTS

| | | |
|---|---|---|
| 5,804,475 A | 9/1998 | Meyer et al. |
| 5,869,845 A | 2/1999 | Vander Wagt et al. |
| 5,883,549 A | 3/1999 | De Los Santos |
| 5,883,829 A | 3/1999 | van der Wagt |
| 5,895,934 A | 4/1999 | Harvey et al. |
| 5,903,170 A | 5/1999 | Kulkarni et al. |
| 5,907,159 A | 5/1999 | Roh et al. |
| 5,936,265 A | 8/1999 | Koga |
| 5,953,249 A | 9/1999 | van der Wagt |
| 5,959,328 A | 9/1999 | Krautschneider et al. |
| 5,962,864 A | 10/1999 | Leadbeater et al. |
| 6,015,978 A | 1/2000 | Yuki et al. |
| 6,077,760 A | 6/2000 | Fang et al. |
| 6,091,077 A | 7/2000 | Morita et al. |
| 6,104,631 A | 8/2000 | El-Sharawy et al. |
| 6,248,606 B1 | 6/2001 | Forbes et al. |
| 6,294,412 B1 | 9/2001 | Krivokapic |
| 6,301,147 B1 | 10/2001 | El-Sharawy et al. |
| 6,303,942 B1 | 10/2001 | Farmer |
| 2001/0005327 A1 | 6/2001 | Duane et al. |
| 2001/0019137 A1 | 9/2001 | Koga et al. |

OTHER PUBLICATIONS

Seabaugh A., Brat B., Broekaert T., Morris F., and Frazier G., "Resonant Tunneling Mixed Signa. Circuit Technology," Solid–State Electronics 43:1355–1365, 1999.

G. Wirth, et al., "Negative Differential Resistance in Ultrashort Bulk MOSFETs," IECON'99 Conference Proceedings, vol. 1, San Jose, 1999, S. 29–34.

R.H. Mathews, et al., "A New RTD–FET Logic Family," Proceedings of the IEEE, vol.. 87, No. 4, pp 571–595, 1999.

J. P. A. Van Der Wagt, "Tunneling–Based 8RAM," Proceedings of the IEEE, vol. 87, No. 4, pp. 571–595, 1999.

C. P. Heij, et al., "Negative Differential Resistance Due to Single–Electron Switching," Applied Physics Letters, vol. 74, No. 7, Feb. 15m, 1999, 5 pages.

C. Pacha, et al., "Resonant Tunneling Device Logic Circuits, "Microelectronics Advanced Research Initiative (MEL–ARI,) Jul. 1998–Jul. 1999, pp. 1–22.

A. Seabaugh, "Promise of Tunnel Diode Integrated Circuits, "Tunnel Diode and CMOS/HBT integration Workshop, Dec. 9, 1999, Naval Research Laboratory, Washington, DC., 13 pages.

Jian Fu Zhang, "Traps:Detrapping, "Wiley Encyclopedia of Electrical and Electronics Engineering Online, Article Posting Date: Dec. 27, 1999, John Wiley & Sons, Inc., 4 pages.

Jian Fu Zhang, "Traps; Effects of Traps and Trapped Charges on Device Performance," Wiley Encyclopedia of Electrical and Elctronics Engineering Online, Article Posting Date: Dec. 27, 1999, John Wiley & Sons, Inc., 2 pages.

Jian Fu Zhang, "Traps Measurement Techniques," Wiley Encyclopedia of Electrical and Electronics Engineering Online, Article Posting Date: Dec. 27, 1999, John Wiley & Sons, Inc., 5 pages.

Jian Fu Zhang, "Traps, " Wiley Encyclopedia of Electrical and Electronics Engineering Online, Article Posting Date: Dec. 27, 1999, John Wiley & Sons, Inc., 2 pages.

Jian Fu Zhang, "Traps: Trapping Kinetics," Wiley Encyclopedia and Electrical and Electronics Engineering online, Article Posting Date: Dec. 27, 1999, John Wiley & Sons, Inc., 2 Pages.

Jian Fu Zhang, "Taps: Origin of Traps," Wiley Encyclopedia of Electrical and Electronics Engineering Online, Article Posting Date: Dec. 27, 1999, John Wiley & Sons, Inc., 4 pages.

Gardner, Carl, Ringhofer, Christian, "Smooth Quantum Hydrodynamic Model Simulation of the Resonant Tunneling Diode," Dept. of Matematical Arizona State University, pp. 1–5, (1998).

Jungel, A. Pohl, C., "Numerical Simulation of Semiconductor Devices: Energy–Transport and Quantum mydrodynamic Modeling,"Fachbereich Math, Tech. Univ. Berlin, Germany, pp. 1–8, 1998.

S.M.A. Nimour, R. Quasti, N. Zekri, "Effects of Spatially Disordered Barriers on the Band Structure of Finite Sperfattices," phys. stat. so. (b) 1998, 209, 311–318.

S. L. Rommel, et al., "Room Temperature Operation of Epitaxially Grown Si/Sio.5Ge0.5./Si Resonant Interband Tunneling Diodes,"Applied Physics Letters, vol. 73, No. 15, pp. 2191–2193, 1998.

News Release from www.surekaiert,org/releasesudel.udcn-flb.html,"UD Computer News: Future Looks Bright for Tunnel Diodes, Promising Faster, More Efficient Circuits," Oct. 1, 1998, 4 pages.

P. Mazumder, et al., "Digital Circuit Applications of Resonant Tunneling Devices," Proceedings of the IEEE, vol. 86, No, 4, pp. 884–888, Apr. 1998.

J. P. Sun, et al., "Resonant Tunneling Diodes: Models and Properties," Proceedings of the IEEE, vol. 86, No. 4, Apr. 1998, pp. 641–661.

J.P.A. Van Der Wagt, et al., "RTD/HFET Low Standby Power SRAM Gain Cell." Source: Corporate Research Laboratories, Texas Instruments, 1998, 4 pages.

C. Pacha and K. Goger, "Design of Arthimetic Circuits using Resonant Tunneling Diodes and Threshold Logic," Lehratuhl Bauelemente der Elektrolechnik, Universitat Dortmund, pp. 1–11, Sep. 1997.

G.I. Haddad et al., "Tunneling Devices and Applications in High Functionality/Speed Digital Circuits," Solid State Electronics, vol. 41, No. 10, Oct. 199, pp. 1515–1524.

S.J. Koester, et al., "Negative Differential Conductance in Lateral Double–Barrier resonant Tunneling Devices," Dept. of Electricla Engineering, Unversity of Notre Dame, pp. 1–7, (1998).

E. Chan, et al., "Mask Programmable Multi–Valued Logic Gate Arrays Using RTDs and HBTs," IEE Proceedings–E: Computers and Digital Techniques, vol. 143, No. 6, Oct. 1998, pp. 286–294.

E. Chan, et al., "Compact Multiple–Valued Multiplexers Using Negative Differential Resistance Devices," IEEE Journal of Solid–State Circuits, vol. 31, No. 6, Aug. 1998, pp. 1151–1156.

S. Mohan, et al., "Ultrafast Pipelined Arithmetic Using Quantum Electronic Devices," IEEE Proceedings–E: Computers and Digital Techniques, vol. 141, No. 2, Mar. 1994, pp. 104–110.

S. Lury and M. Mastrapasqua, "Ligh–emitting Logic Devices based on Real Space Transfer in Complementary InGaAs/inAIAs Heterstructures," in "Negative Differential Resistance and Instabilities in 20 Semiconductors" ed. by N. Baltran, B.K. Ridley, an A.J. Vickers, NATO ASI Series (physics) b 307, pp. 53–82, Phamon Press (New York 1993).

S. Mohan, et al., "Logic Design Based on Negative Differential Resistance Characteristics of Quantum Electronic Devices," IEEE Proceedings–G; Electronic Devices, vol. 140, No. 6, Dec. 1983, pp. 383–391.

Serge Luryi and Mark Pinto, "Collector–Controlled States in Charge Injection Transistors," SPIE 82 Symposium, pp. 1–12, 1992.

Serge Luryi and Mark Pinto, "Collector–Controlle dstates and the Formation of Hot Electron Domains in Real–Space Transfer Transistors," AT&T Bell Laboratories, pp. 1–7, 1992.

S. Mohan, et al., "Ultrafast Pipelined Adders Using Resonant Tunneling Transistors," IEE Electronics Letters, vol. 27, No. 10, May 1991, pp. 830–831.

O. Le Neel, et al., "Electrical Transient Study of Negative Resistance in SOi MOS Transistors," Electonics Letters, vol. 26, No. 1, pp. 73–74, Jan 1990.

P.S. Barlow, et al., "Negative differential output conductance of self–heated power MOSFETs," IEE Porceedings–1 Solid–State and Electron Devices, vol. 133, part 1, No. 5, Oct. 1988, pp. 177–179.

Farid Nemati et al., "Novel High Density, Low voltage SRAM cell with a Vertical NDR Device," Center for Integrated Systems, Stanford University, Ca, (2 pages).

Farid Nemati et al., "A Novel Thyriator–based SRAM Cell (T–Ram) for High–Speed, Low–Voltage, Gigs–scale Memories," Center for integrated Systems, Stanford University, CA, (4 pages).

Bhoucair, F. et al., "Analysis and Simulation of Simple Translator Structure Exhibiting Negative Differential Resistance, " EECS Department, UC Berkeley Ca., (4 pages).

R. Oberhuber, et al., "Tunnel–Devices with Negative Differnetial Resistivity Based on Silicon?" Source: Deutsche Forschungegemeinschaft and Siemens AG, date unknown, 2 pages.

* cited by examiner

Fig. 4

| |
|---|
| Standard CMOS Starting Material |
| Standard CMOS Isolation Process |
| NDR Surface Doping Process Sequence |
| NDR Device Gate Insulator Formation |
| N-well Dopant Process Sequence (for PMOS) |
| P-well Dopant Process Sequence (For NMOS) |
| Logic Device Gate Oxidation |
| Gate Material Deposition and Patterning |
| NDR Drain Junction Engineering Sequence |
| Source/Drain Pattern and Process Sequence |
| Oxide Deposition |
| Contact Process Sequence |
| Metal Process Sequence |

NDR Mode Enabled                NDR Mode Disabled

METHOD OF ORPERATING A DUAL MODE FET & LOGIC CIRCUIT HAVING NEGATIVE DIFFERENTIAL RESISTANCE MODE

CROSS REFERENCE TO RELATED APPLICATIONS

The present application is a divisional of Ser. No. 10/028,394 filed Dec. 21, 2001 now U.S. Pat. No. 6,518,589 entitled Dual Mode FET & Logic Circuit Having Negative Differential Resistance Mode which is hereby incorporated by reference as if fully set forth herein.

The present application is also a continuation-in-part of each of the following applications, all of which were filed Jun. 22, 2000 and are hereby incorporated by reference as if fully set forth herein:

Ser. No. 09/603,101 now U.S. Pat. No. 6,512,274 entitled "A CMOS-PROCESS COMPATIBLE, TUNABLE NDR (NEGATIVE DIFFERENTIAL RESISTANCE) DEVICE AND METHOD OF OPERATING SAME"; and Ser. No. 09/603,102 now U.S. Pat. No. 6,479,862 entitled "CHARGE TRAPPING DEVICE AND METHOD FOR IMPLEMENTING A TRANSISTOR HAVING A NEGATIVE DIFFERENTIAL RESISTANCE MODE"; and Ser. No. 09/602,658, now abandoned, entitled "CMOS COMPATIBLE PROCESS FOR MAKING A TUNABLE NEGATIVE DIFFERENTIAL RESISTANCE (NDR) DEVICE."

FIELD OF THE INVENTION

This invention relates to semiconductor devices and more particularly to a novel field effect transistor (FET) device and accompanying logic circuit that is multifunctional and selectively operates in two different modes, including in a mode that exhibits negative differential resistance (NDR). The present invention is applicable to a wide range of semiconductor integrated circuits, particularly for logic applications where it is desirable to achieve a high level of functional integration using multi-functional devices that can perform multiple boolean operations and/or multiple circuit operations.

BACKGROUND OF THE INVENTION

A new type of CMOS compatible, NDR capable FET is described in the aforementioned applications to King et al. referenced above. The advantages of such device are well set out in such materials, and are not repeated here. Nonetheless, in some environments, or during certain processing operations, it may be desirable to selectively disable the NDR capability of such device, and instead operate such device in a manner similar to that for any other conventional FET. This selective switching between modes is not practically possible with prior art NDR implementations (such as tunnel diodes for example) but if such were available it would make it feasible nonetheless to construct a multi-mode, multi-functional device. In other words, a single device could be constructed to perform more than one logical operation on one or more signal inputs. An improved device shown in U.S. Pat. No. 6,097,036 (incorporated by reference herein) details how a single semiconductor logic element can be constructed to perform more than one logic operation using a tunneling effect, but the latter mechanism is typically implemented with a GaAs (non-CMOS compatible) manufacturing process that is unattractive for mainstream semiconductor fabrication facilities. A similar limitation is apparent for the traditional resonant tunneling diode (RTD) based devices as depicted for example in FIG. 3 of a reference from the Microelectronics Advanced Research Initiative entitled "Resonant Tunnelling Device Logic Circuits" Technical Report July 1998–July 1999 by Pascha et al., the entirety of which is incorporated herein. This reference illustrates a typical example of a monostable—bistable RTD inverter whose output varies depending on the state of an input clock. In other words, it can selectively induce an NDR effect in a tunneling diode so that in a non-NDR operating region the circuit has one type of output (linear or monostable) while in an NDR operating region the circuit has a bistable output. While this circuit is useful for large scale integrated logic circuits, it would be more useful to have an NDR device in which the actual NDR effect itself can be selectively enabled or disabled, so that in a non-NDR mode a device will not enter into an NDR operating region even with operating parameters which would otherwise be expected to induce such NDR effect.

SUMMARY OF THE INVENTION

Accordingly, an object of one aspect of the present invention is to provide an improved multi-mode FET that can be selectively controlled to operate in either an NDR mode or an non-NDR mode;

A related object of another aspect of the invention is to provide an improved multi-mode logic circuit employing the aforementioned multi-mode FET, and which can be programmed to perform two distinct logic operations, including a first type of logic operation in an NDR mode, and a second type of logic operation in a non-NDR mode;

A further object of the invention is to provide an improved multi-mode logic circuit that can be programmed and/or adjusted to perform two different boolean logic operations on a set of inputs, and/or two different circuit operations for a variable input;

A related object of the present invention is to provide a multi-terminal structure for controlling and programming the aforementioned multi-mode FET and/or multi-mode logic circuit, including the type of logic operation to be performed;

Yet another object of the present invention is to provide a new programmable logic FET which can be fabricated with a process that is fully compatible with conventional CMOS process technology, and yet be able to simultaneously provide more than one logical operation or function;

Another object of the present invention is to provide an improved multi-mode FET that is not based on heterostructure materials, or expensive fabrication techniques such as molecular beam epitaxy (MBE);

Another object of the present invention is to provide a new type of electronic logic circuit or logic family that can supplement and/or replace conventional semiconductor FET logic families, and in so doing effectuate new embodiments of common but critical logic circuits that are smaller, faster and more easily integrated;

Another object of the present invention is to introduce a new type of electronic logic family that has a number of useful characteristics and capabilities, including controlled programmable and re-programmable functionality at the single device level, and multiple simultaneous functionality, so that a new CMOS compatible logic building block can be provided for higher scale integrated circuits used in digital signal processors (DSPs) microprocessors, etc with a reduced gate count per logic function;

A further object of the invention is to provide a cost effective and reliable manufacturing method for making the aforementioned multi-mode FET and logic circuit, preferably using CMOS compatible processes that are easily integrable into commercial fabrication facilities.

These and other objects are achieved by the present invention that discloses an electronic device having a semiconductor structure adapted to selectively operate in a negative differential resistance mode through the use of a terminal coupled to a region of the semiconductor structure for receiving a mode selection signal. This mode selection signal selects whether the negative differential resistance mode is enabled or disabled; i.e., whether the device can exhibit NDR characteristics, or is limited to conventional FET characteristics. In a preferred embodiment, the semiconductor structure is substantially that of a four terminal FET that operates selectively in an NDR mode or a non-NDR mode through control of a bias signal applied to one of such terminals (e.g., a body terminal contact). The negative differential resistance mode is caused within a single semiconducting channel of the semiconductor structure at least in part by temporary electron trapping within a gate dielectric of the semiconductor structure. Stated another way, a negative differential resistance mode is created at least in part by dynamically varying the threshold voltage of the FET. The threshold voltage is adjusted by selectively removing hot carriers within the channel so as to set up a depletion region for reducing current carrier density in the channel. A trapping layer, adjacent to the channel, is used for temporarily trapping a sufficient number of carriers to cause the negative differential resistance mode.

The semiconductor structure is manufactured using standard complementary metal oxide semiconductor (CMOS) fabrication processes, including conventional masking, patterning, etching, thermal oxidation, implant, annealing, thermal treatment and deposition techniques normally used for making semiconductor devices. A multi-mode field effect transistor (FET) device is thus constructed through such processes to include: a first region configured as a source for the FET; a second region configured as a drain for the FET; and a third region configured to serve as a gate for the FET. The source and drain are coupled by a channel region which can be selectively controlled, under a suitable bias condition applied to the gate, to have a first negative differential resistance mode, or a second non-negative differential resistance mode. A fourth region acts as a body for the FET, and is configured to receive the aforementioned mode select signal. Thus, the structure is preferably formed of materials located in or on a silicon based substrate.

The mode selection signal can be varied as well by a control circuit so that the semiconductor structure is dynamically programmable to a negative differential resistance mode or a non-negative differential resistance mode. With this type of configuration, a semiconductor structure can cause a first circuit function to be performed on an input signal when a negative differential resistance mode for such structure is enabled, or alternatively cause a second circuit function to be performed on the input signal when the negative differential resistance mode is disabled.

The non-negative differential resistance mode could be employed by the semiconductor structure to store configuration information for a larger device. In addition to a multi-mode circuit function on a single input, the semiconductor structure can also cause a first boolean operation to be performed on a set of input signals when the negative differential resistance mode is enabled, or alternatively it can cause a second boolean operation to be performed on the input signal when the negative differential resistance mode is disabled.

A larger multi-element multi-mode electronic circuit can be constructed using one or more of the aforementioned semiconductor structure elements as a building block, along with optional additional conventional FET and/or passive semiconductor elements. Thus, such circuit includes at least one first type semiconductor structure adapted to selectively operate in a negative differential resistance mode as noted earlier. A second type semiconductor structure is coupled to the at least one first type semiconductor structure; this second type semiconductor is preferably comprised of conventional semiconductor elements and is thus adapted to operate only in a non-negative differential resistance mode.

In this fashion, the multi-mode electronic circuit performs a first circuit function on an input signal when the negative differential resistance mode is enabled, and a second circuit function on input signal when the negative differential resistance mode is disabled. For example, a first circuit function could be an inverter function, while a second circuit function could be a fixed voltage output (usable as a set or reset signal or to store configuration information).

When multiple inputs are desirable (such as for performing a logic operation), the circuit is thus capable of performing a first boolean operation when the negative differential resistance mode is enabled, and a second boolean operation when the negative differential resistance mode is disabled. In a preferred embodiment, the first Boolean operation is an XNOR function, and the second Boolean operation is a NOR function. As above, the mode selection signal can be varied during operation of the multi-mode electronic circuit to dynamically change the logic operation as needed to effectuate the desired logic function. In this fashion, a true programmable logic block or processing engine can be, constructed that multi-tasks because it can perform the same functionality as the equivalent of two prior art circuits but in less than half the space. Using one easily measurable metric, it is apparent that the invention affords a function/element ratio greater than 0.5, and approaching 1.

A method of operating the aforementioned multi-mode electronic device generally includes the following steps: operating a semiconductor structure in a first mode characterized by negative differential resistance in at least one operating region of the structure; and operating the semiconductor structure in a second mode characterized by a non-negative differential resistance in such operating region; and coupling a region of the semiconductor structure to a mode selection signal; and selecting whether the first mode or the second mode is enabled for said semiconductor structure using the mode selection signal.

BRIEF DESCRIPTION OF THE DRAWINGS

FIG. 4 is an illustrative process sequence for integrating the NDR-MISFET into a conventional CMOS logic process flow;

DETAILED DESCRIPTION OF PREFERRED EMBODIMENTS

Figure 1:
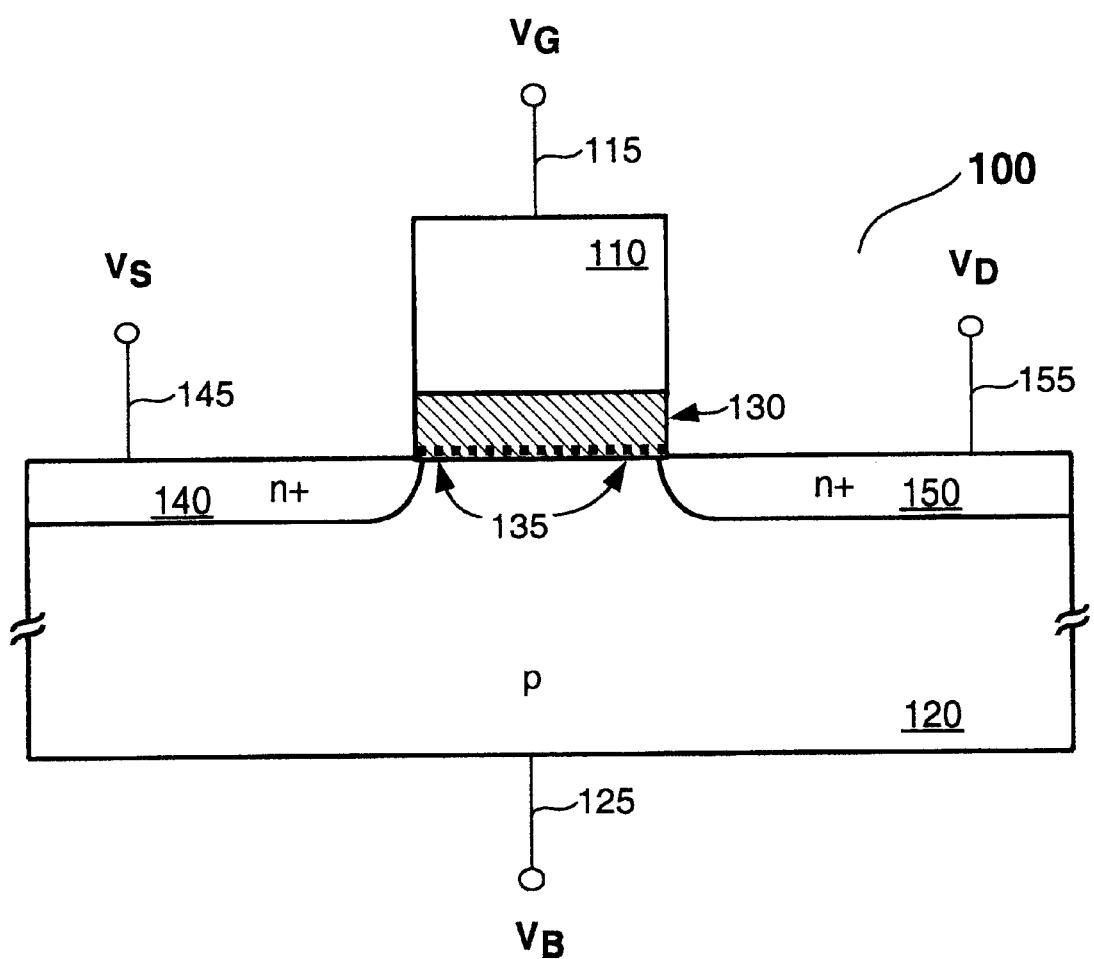
FIG. 1 is the schematic cross-sectional view of an embodiment of the NDR metal-insulator-semiconductor field-effect transistor (MISFET) disclosed in this invention, including a body contact terminal 125 for receiving an NDR mode enable/disable bias signal.

The following detailed description is meant to be illustrative only of particular embodiments of the invention. Other embodiments of the invention and variations of those disclosed will be obvious to those skilled in the art in view of the following description.

As discussed below, a preferred device embodiment is described first. Next, the mechanism responsible for the negative differential resistance (NDR) mode is described, followed by additional preferred embodiments for enhancing the performance of an NDR device. Finally, an exemplary method of fabrication will be described.

In accordance with a preferred embodiment of the invention, an n-channel MISFET NDR device structure (FIG. 1) 100 is provided which is made with minimum modification to a standard CMOS process. In fact, from a first glance, device 100 appears to be an ordinary n-channel MOS (NMOS) transistor, in which a gate electrode 110 of the device is formed on top of a semiconductor substrate 120 and electrically insulated from the substrate by a dielectric layer 130. Right away it can be seen that NDR device 100 in this invention is distinctly different from NDR devices in the prior art.

Prior-art NDR, devices are typically two-terminal diode devices, made with very complicated and expensive process sequences which are incompatible with a conventional CMOS process. Although NDR device 100 in this invention is similar in appearance to an NMOS transistor, it incorporates slight but critical modifications, as taught in this invention, in order for the device to manifest the desired NDR output characteristic mode.

A first modification is that a p-type dopant concentration in a surface region of the semiconductor substrate underneath the gate electrode (the channel) is relatively high compared to a contemporary conventionally processed n-channel device. In a preferred embodiment of device 100, the p-type dopant concentration is greater than $1 \times 10^{18}$ cm$^{-3}$ in the channel. Of course, it will be understood that for any particular design rule, device characteristic and process environment the p-type dopant concentration may be varied accordingly, and that some routine design, simulation and/or testing may be necessary to optimize the performance of the device in any particular application. Accordingly, the present invention is not limited to any particular concentration, but, instead, is guided more by considerations of whether a sufficient dopant concentration has been introduced to help contribute to the NDR effect. More heavily doped n-type regions in the semiconductor surface region, adjacent to the channel and located at each end of the gate electrode, form the source and drain contact regions 140 and 150 respectively. The electric potential of the channel can be further adjusted via a body contact terminal 125.

A second modification of present device 100 over a conventional transistor is the fact that charge traps or storage nodes 135 exist in insulating layer 130 between semiconductor substrate 120 and gate electrode 110. These charge traps are located relatively close to (within 1.5 nm of) semiconductor-insulator interface 138, so that charges from semiconductor 120 can be trapped and de-trapped very quickly. Again it will be understood that this distance figure is based on the details of the present embodiment, and that for any particular environment this parameter may vary significantly, so the present invention is not limited by the particular details of the same. The key point, of course, is the existence of these charge traps, or some other physical feature that acts to store electrons. It will be understood of course that the drawing of FIG. 1 is merely an illustration to better describe the features of the present invention, and thus the arrangement and location of the trapping sites 135 is not drawn to scale. A third modification is that insulating layer 130 between semiconductor substrate 120 and gate electrode 110 is relatively thick (greater than 6 nm) to prevent significant loss of trapped charge to the gate electrode via tunneling. Those skilled in the art will again appreciate that this thickness is again a function of the particular material, processing environment, etc., and that the present invention is by no means limited to such figure.

Figure 2:
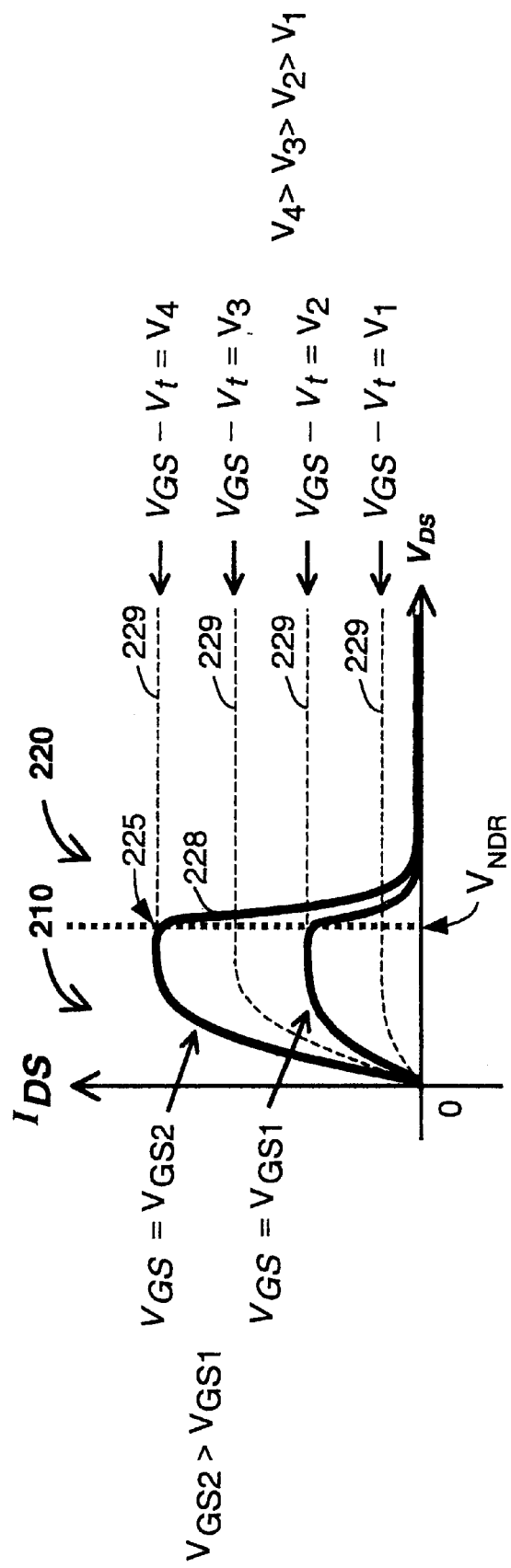
FIG. 2 is a graphical chart illustrating the current versus voltage (I-V) characteristics of the NDR-MISFET, including an NDR operating region.

With source and body terminals 145 and 125 of device 100 held at ground potential and gate terminal 115 biased sufficiently high to turn on the device, the output characteristic (drain current as a function of drain voltage) of device 100 will exhibit negative differential resistance over a range of drain voltages. This aspect of the invention is illustrated in FIG. 2, where device drain current versus drain voltage is plotted for two different gate voltages to show how the NDR mode can be affected by a suitable selection of the gate voltage. It can be seen that for a fixed gate voltage $V_{GS}$, drain current $I_{DS}$ firstly increases in a first region 210 with drain voltage $V_{DS}$, similarly to the behavior that is seen in drain current in a conventional NMOS transistor. Surprisingly, however, in region 220, beyond a certain drain voltage level, drain current decreases with further increases in voltage, i.e. the device exhibits an NDR mode with NDR characteristics. The drain voltage at which the drain current begins to decrease (i.e., point 225 where $V_{DS}=V_{NDR}$) is adjustable through suitable selections of channel length, threshold voltage, etc. It should be noted that, due to the relatively high channel dopant concentration and the relatively thick gate dielectric, the threshold voltage of the NDR FET will be significantly higher than that of a conventional MOSFET, so that a larger than typical gate voltage is correspondingly used for the NDR FET. As a result, $V_{GS}>V_{NDR}$ so that the vertical electric field is in the direction such that electrons are attracted towards the gate electrode, enhancing the NDR effect.

This behavior by device 100 of the present invention is rather surprising, and is apparently the result of physical mechanisms that have hitherto not been exploited in this area of semiconductor devices and processing. In the prior art, band-to-band quantum-mechanical tunneling of charged particles (electrons and/or holes) from one side of a diode to the other side is known to be the primary mechanism for NDR in tunneling diodes. In contrast, for device 100 of the present invention, the physical mechanism appears to be rapid trapping of electrons in the gate insulator underneath the gate electrode, near to (within 1.5 nm of) the semiconductor-insulator interface. Referring to the device structure in FIG. 1, when device 100 is biased with a sufficiently high gate voltage such that the channel of the device is in the strong-inversion condition (ie. when the gate-to-source voltage is greater than the threshold voltage), a current flows between the source and drain terminals 145 and 155 respectively of the device if a small voltage is applied between such terminals. Since the channel is configured to contain a relatively high p-type dopant concentration, a vertical (in the direction perpendicular to the semiconductor surface) electric field in the channel is large (greater than $10^6$ V/cm). As the drain-to-source voltage increases, the lateral (in the direction parallel to the semiconductor surface) electric field increases, so that a composite (horizontal+vertical) electric field exerting force on inversion-layer electrons in the channel increases. Once this composite electric field reaches a certain critical value (which of course will be a function of the doping and geometry of the device) electrons flowing from source 140 to drain 150 will gain sufficient energy between collisions to surmount a semiconductor-insulator interface potential barrier. Since the vertical electric field component attracts the electrons toward gate electrode 110, electrons enter insulator 130 and subsequently are captured by the traps or storage nodes 135 in the insulator. The presence and accumulation of negative charge in insulator 130 dynamically increases a threshold voltage of device 100. In other words, the electrons accumulated in the traps/storage nodes 135 operate to set up a counter field that inhibits the movement of additional electrons into the channel from the source, and reducing an available channel current by reducing a density of electrons in the channel region. Thus, the net effect created by the traps/storage nodes 135 of the present invention is a drastic reduction in the inversion-layer charge density and commensurate reduction in the current flowing between the source and the drain. It can be seen plainly that the amount of net current in the channel that can be affected by the traps is a function of their number, concentration, location, and the bias conditions imposed on device 100, all of which are easily controllable and optimizable for any particular environment, so that the onset conditions, strength and operating region for a negative differential resistance mode can be tailored and customized as needed.

It is noted that the present disclosure teaches that only a single species of energetic carriers (hot electrons) are generated in a channel region and trapped in insulator 130, and both of these phenomena preferably occur in a substantially uniform manner throughout the channel length. This operation, too, is distinctly different from the case for a conventional NMOS transistor, in which hot electrons are generally generated in the depletion region of the drain p-n junction, leading to impact ionization and an avalanche effect resulting in significant numbers of hot holes as well as hot electrons. Typically, this effect is maximized at a gate-to-source voltage which is lower than the drain-to-source voltage (for example, at a gate voltage equal to one half the drain voltage); hence in a conventional device the vertical electric field in the channel near the drain junction attracts hot holes, rather than hot electrons, toward the gate electrode. Clearly, then, this explains why the creation of hot electrons in a conventional NMOS transistor (even if it occurs incidentally) cannot produce the negative differential resistance characteristic as described in this invention. Furthermore it is well known that the injection of hot holes into the gate insulator causes damage, adversely affecting the performance and reliability of the NMOS transistor. In the NDR-MISFET 100 of the present invention, although holes are generated by impact ionization in the channel, they are not injected (or their injection is substantially eliminated to the point where it is negligible from an operational perspective) into gate insulator 130 because the vertical electric field repels holes from gate electrode 110.

As a point of further clarification, the mechanism responsible for the NDR characteristic of the present invention also does not require that NDR MISFET 100 be operating in a conventional "pinch-off" condition, i.e., in which a gate-to-drain voltage is lower than a threshold voltage so that the inversion-layer charge density in the channel adjacent to the drain is zero. In the pinch-off condition, the lateral electric field is non-uniformly distributed in the channel between the source and drain: the electric field increases gradually and linearly with distance away from the source, and then increases exponentially in the depletion region of the drain junction, so that the generation of hot electrons occurs predominantly in the depletion region of the drain junction, resulting in drain avalanche. In contrast, in the present invention, NDR-MISFET 100 is preferably operated in a "triode" region, so that the electric field increases uniformly from the source end of the channel to the drain end. The drain current saturates due to velocity saturation, not pinch-off, so the current does not increase linearly with $V_{DS}$ (as seen generally in FIG.2).

In a preferred embodiment of NDR-MISFET 100, sufficient bias is applied so that the electrons in the channel become so energetic that channel hot electrons arc created due to the high composite electric field in the channel. These channel hot electrons have sufficient energy imparted from the horizontal component of this field to surmount the potential barrier at the semiconductor-insulator interface and enter gate insulator 130 because the vertical electric field component attracts them toward gate electrode 110. The electrons are captured by the traps or storage nodes 135 in insulator 130; consequently the threshold voltage of the transistor increases dynamically. More charge is trapped as the drain-to-source voltage increases (for a constant gate voltage), because the generation of hot carriers (and thus the percentage of the current that is based on a hot carrier component) correspondingly increases, and it is these hot carriers that are trapped. As greater numbers of hot carriers are trapped, they increase the threshold voltage and thereby reduce the mobile charge density in the channel by a disproportionate amount (compared to the hot-carrier current charge amount), thus decreasing the drain current dramatically. This results in the negative differential resistance in the output (drain current versus drain voltage) characteristic. It can be seen also that more charge can be trapped by increasing the vertical component of the field as well, since this increases the likelihood that a charged carrier will be forced into a trap 135 in dielectric layer 130 (the trapping rate), and also increases a temporary storage/trapping time associated with the charge. It is not necessary, nonetheless, to trap a significant number of carriers, because even a small quantity stored in the trapping sites can be sufficient to deplete the channel of mobile carriers. It is also preferable to not increase the vertical field to the point where some deleterious side effects (dielectric breakdown or lack of fast reversibility of the NDR effect for example) are seen. In other words, it is generally desirable to have the charges rapidly trapped and de-trapped at a particular rate that ensures that the device can be put into and out of an NDR mode or operating region quickly, instead of being confined to working within a particular region. Other techniques for increasing the amount of trapped charges, and the trapping/detrapping rates will be apparent to those skilled in the art. For instance, it may not be necessary in fact in some applications, to make the electrons "hot" because they will still be swept by the vertical field into the trapping sites.

Thus, the present invention uses an approach that is in contrast to that of prior art which has charge traps, such as U.S. Pat. No. 5,633,178. In the prior art, the emphasis has been on retaining the charge as long as possible, and this reference for example specifically discloses using a refresh operation to keep the logic state. Accordingly, there is no effort made in the prior art to implement or sustain a dynamic process where charges are continually trapped and de-trapped. In fact conventional disclosures discourage such condition because it has been perceived to date as an undesirable situation, and so this explains, too, why such references do not describe configuring a FET channel to have a structure and doping characteristics that would facilitate this type of trapping/detrapping mechanism.

The drain current and therefore the negative differential resistance in this invention can be adjusted by varying the gate voltage as seen in FIG. 2. As seen also in FIG. 2, the invention can be seen as exploiting the fact that, as the threshold voltage $V_t$ dynamically increases (because of the accumulation of trapped charges) with increasing drain-to-source voltage $V_{DS}$, a drain current $I_{DS}$ (which is proportional to $V_g - V_t$) will first increase, and then begin to decrease as $V_t$ begins to exceed $V_g$ and thus dominate the behavior of the device. Thus, a current value depicted in curve 228 will generally follow the set of continuous curves 229 shown in FIG. 2 for a given $V_g$ and varying $V_t$. The so-called "peak-to-valley ratio," a key figure of merit in NDR devices, can also be tuned in the present invention through suitable combinations of doping concentrations, device geometries and applied voltages.

The present invention bears some resemblance to a leaky (or volatile) floating gate storage device. However, the trapping and de-trapping of electrons in gate insulator 130 of NDR-MISFET 100 are very rapid processes, as compared to the programming and erase processes of a conventional floating-gate non-volatile memory device, so that the threshold voltage of NDR-MISFET 100 can respond dynamically to changes in a gate-to-source voltage and/or a drain-to-source voltage. In fact, while conventional memory devices require extensive pre-programming and erase cycle times to change threshold states, the threshold voltage of the present device responds to the applied source to drain bias voltage with minimal delay. Thus, it can change and reverse a threshold (and thus achieve an NDR mode) in substantially the same time as it takes for device 100 to turn the channel on or off in response to such bias conditions. For any given bias condition (fixed gate-to-source and drain-to-source voltages), a steady-state condition exists in which electrons are continually being rapidly trapped, stored, and de-trapped, maintaining a fixed amount of net charge trapped in gate insulator 130. The fixed amount of net charge trapped in the gate insulator is dependent on the particular voltage bias conditions applied to device 100. As the gate-to-source voltage and/or the drain-to-source voltage changes, the balance of the trapping and de-trapping processes changes, thereby changing the fixed amount of net charge trapped in the gate insulator and dynamically changing the threshold voltage. This means the net NDR effect can be controlled through two different bias parameters, a significant advantage again over conventional two terminal NDR devices. Furthermore, the negative differential resistance characteristic is seen not only as the drain-to-source voltage is increased from zero Volts to a high value (such that hot electrons are trapped in gate insulator 130), but also in the reverse direction as the drain-to-source voltage is decreased from a high value to zero Volts. It is expected, in fact that the threshold voltage variability/reversibility can be tailored to be relatively symmetric, so that it can thus be adjusted from a relatively low voltage value to a relatively high voltage value in approximately the same time required to adjust the threshold voltage from a relatively high voltage value to a relatively low voltage value.

As intimated above, the inventors believe that at higher drain to source voltages another feature of the present invention will be apparent, and that is the relatively high percentage of hot carriers in the channel current. Namely, since hot carriers are generated at a faster rate as the drain to source voltage increases the inventors believe that the net result is that eventually the hot carrier current component of the channel current will become dominant, and thus eventually constitute the only current component in the channel, even if it is extremely small overall. The relative percentage of hot carriers in the channel current, therefore, can be controlled, and this feature of the invention may be beneficial in other application environments.

Another aspect of the invention that is potentially usefull is the fact that the trapping sites of the present invention can be thought of as introducing a form of current/charge delay on a single channel basis. The trapping time, temporary storage time, and detrapping time making up such delay can be controlled as a function of the applied horizontal and vertical electrical fields, and this aspect might be exploited in other environments.

As explained herein, the p-type dopant concentration in the surface region of the semiconductor underneath the gate electrode should be relatively high. This is to ensure that the vertical electric field is high (greater than $10^6$ V/cm) when the transistor is turned on, to promote the creation of hot electrons in the channel. A conventional NMOS transistor with channel length less than 250 nm may (in some applications) have such a high channel dopant concentration, but it will not achieve the results of the present invention because this structure alone is insufficient to bring about an NDR effect. In a preferred embodiment, the doping concentration is made slightly graded, so that the concentration of dopant is slightly lower at the semiconductor surface, and then peaks at some relatively small distance (below 30 nm) below the surface. This is done in order to achieve a built-in electric field, which in turn serves to confine electrons near the surface of the semiconductor, and thus further enhances the injection of electrons into the trapping sites in the dielectric. Again, other doping concentrations and techniques can also be employed to induce this same phenomenon.

Furthermore, to minimize the possibility of drain avalanche, a preferred embodiment herein teaches that the drain dopant-concentration profile at the junction with the channel is made to be relatively lightly doped. This not only minimizes the impact ionization current between the drain and the channel, but also has the side benefit of minimizing the capacitance between them. By minimizing the drain junction capacitance to the channel, the overall device switching performance is enhanced and the device thus operates faster. Those skilled in the art will appreciate that there are other ways to enhance the generation of hot electrons in the channel in addition to those described herein, and the present invention is not limited to any particular implementation of the same.

A preferred embodiment also confines the relatively high dopant concentration in the channel to the surface region only, so that the dopant concentration in the channel region is initially low (to confine electrons to the surface region), then increases, and then is made lower away from the surface to achieve the effect of low drain-junction capacitance. As alluded to earlier, the present invention is not limited to any particular doping concentration and profile of the dopant in the channel, because the range of such parameters necessary to bring about the NDR effect will vary from device to device of course, depending on the size, geometry, intended function, etc., of the device, but these details can be gleaned with routine and conventional simulation and testings for any particular application, in the same manner as is done for any other conventional semiconductor device. As explained previously, the high surface dopant concentration in the channel should also be offset from the highest dopant concentration in drain region 150 through the use of lightly doped drain (LDD) structures.

One additional and very desirable feature of the present invention is that the drain voltage at the onset of negative differential resistance can be scaled with the scaling of the CMOS technology. In other words, as the transistor channel length is reduced, the drain voltage required to reach the critical composite electric field in the channel (corresponding to the onset of negative differential resistance) is commensurately reduced. This aspect of the invention ensures that the structures and methods taught herein are guaranteed to have substantial and meaningful future utility in advanced generations of devices and products that are made using smaller geometries, lower bias conditions, etc. than those currently available.

Figure 3:
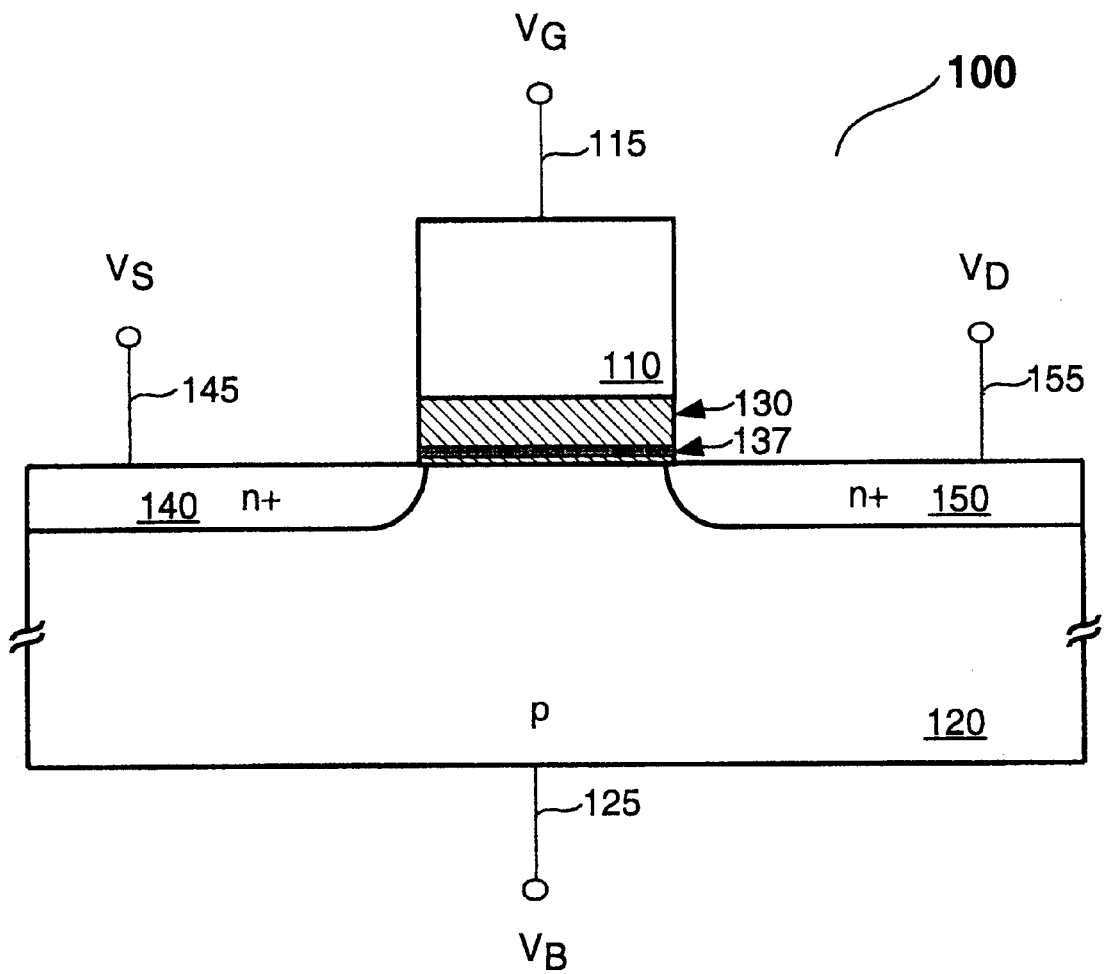
FIG. 3 is the schematic cross-sectional view of another embodiment of the NDR-MISFET disclosed in this invention including a body contact terminal 125 for receiving an NDR mode enable/disable bias signal.

As is evident, a key feature of NDR-MISFET 100 is that charge traps or storage nodes 135 exist in gate insulator 130, very near to (within 1.5 nm of) the semiconductor-insulator interface, so that electrons can be trapped and de-trapped very quickly. The creation and distribution/location of such traps 135 can be accomplished in any number of ways that are compatible with conventional semiconductor processing techniques. For example, traps 135 can consist of defect sites within gate dielectric 130 as shown in FIG. 1, or interfacial traps 135 between two or more layers of a multi-layered gate-insulator stack, or one or more electrically isolated ("floating") conductor or semiconductor electrodes 137 embedded within a gate insulator 130 (made up of two layers 130' and 130" sandwiching the embedded electrode 137) as shown in FIG. 3. The only important consideration is that the carrier trapping sites are configured for trapping carriers that are electrically biased by an electrical control field (i.e., the combined effect of bias conditions resulting from the channel doping, the gate to source voltage, the source to drain voltage) to move from the channel into insulator/dielectric layer 130. This can be done in any number of different concentrations and arrangements within layer 130 so that the channel current can be varied all the way from essentially zero (no conduction) to full conduction in accordance with the strength of the electrical control field.

In a preferred embodiment of the present invention, Boron atoms incorporated into gate insulator 130 during a thermal oxidation of heavily boron-doped silicon serve to provide defect sites which readily trap charge. Alternative embodiments may employ alternative dopant species such as Indium to form charge traps 135, and the present invention is not limited to any particular dopant species in this regard.

As mentioned, other possible embodiments may employ a multi-layered gate insulator, for example a very thin interfacial layer of silicon dioxide and a thicker layer of a second dielectric material such as silicon nitride, with charge-trapping sites at the dielectric-dielectric interface. Further possible embodiments may incorporate islands of metal, silicon or germanium nanocrystals embedded within gate insulator, or perhaps even a single continuous floating gate electrode (FIG. 3) 137, to trap charge. In fact, the present approach can be taken to an extreme to effectuate a new type of non-volatile floating gate electrode for a flash memory cell. It can be seen that complete. non-volatility can be achieved by simply locating the trapping sites sufficiently far away from the interface so that the charge does not leak off after it is put there (using conventional programming techniques). This type of discontinuous floating gate electrode, formed as a multitude of trapping sites distributed in the gate dielectric, may have significant operating advantages over conventional continuous electrode. In particular, in the distributed charge storage sites aspect of the present invention, the trapped charge has less mobility than an electron in a sheet type electrode, and thus the charge storage sites are less likely to leak the stored charge (individually and in the aggregate of course) to the source/drain regions. This in turn means that the charge storage sites can be located closer to the channel, and thus the gate insulating layer can be thinner, the programming voltage and/or current smaller, etc., Other methods and techniques for creating and distributing traps 135 in a fashion suitable for achieving an NDR effect, and any non-volatile effects as shown herein will be apparent to those skilled in the art from the present teachings, and can be further gleaned from the descriptions given in the aforementioned prior art references for creating different types and arrangements of charge traps.

To enhance the electron trapping stemming from the generation of hot electrons in the channel (since it is the primary mechanism responsible for the negative differential resistance characteristic) the present disclosure also teaches a preferred embodiment of an insulator 130 for retaining the trapped charge under high gate-voltage bias. To avoid the loss of trapped electrons to gate electrode 110 via tunneling through gate insulator 130, the latter should have sufficient thickness to prevent or at least substantially reduce such tunneling effects. In a preferred embodiment insulator 130 is silicon dioxide formed by either one of, or a combination of conventional thermal oxidation and deposition techniques. As referred to earlier, to avoid significant loss of trapped charge due to quantum-mechanical tunneling, gate insulator 130 is formed to have a thickness of at least 6 nm. Other implementations of insulator material for layer 130 include Silicon Nitride ($Si_3N_4$), or Silicon Oxynitride ($SiO_xN_y$), or a high-permittivity dielectric (relative permittivity greater than 8). The use of a high-permittivity gate dielectric is advantageous for achieving high areal gate capacitance, which facilitates adequate gate control of the channel potential. Again, the present invention is not restricted to any particular selection of thickness and material for insulator layer 130, and other variations/techniques for achieving a reduction in quantum-mechanical tunnelling known in the art can be used to the extent they are compatible with the present objectives.

For a preferred embodiment of this invention, polycrystailine silicon (poly-Si) is used as the material for gate-electrode 110. Other possible embodiments may utilize alternative gate materials such as polycrystalline silicon-germanium or metals, or any number of other conventional materials.

An exemplary process for fabricating the NDR-MISFET in a conventional CMOS fabrication facility is depicted in FIG. 4 A standard p-type silicon starting substrate 120 is first processed through standard isolation-structure-formation process steps; the surface of substrate 120 is then moderately doped (to ~$5 \times 10^{18}$ cm$^{-3}$) by a shallow Boron implant. Subsequent to this a deposition of silicon dioxide (~6 nm) is done (or thermal oxidation) in a manner so that the Boron becomes incorporated into a gate insulator 130 near the surface of silicon substrate 120. The resultant dopant concentration in the Si channel near the surface is several times lower than it is directly after the implant step above, due to segregation of Boron into gate insulator 130. As noted earlier, the Boron dopant then acts effectively as an electron trap during operation of device 100. In contrast to some of the prior art implantation techniques discussed earlier, the oxidation step appears to incorporate the Boron in a manner that facilitates shallow electron traps, making it easier for charge to move in and out of gate insulator 130.

Next, polycrystalline silicon is deposited and patterned to form gate electrode 110. N-type dopant ions such as Arsenic are subsequently implanted at moderate dose to form the lightly doped source/drain regions self-aligned to gate 110, after which sidewall spacers (not shown) are formed by conformal deposition and anisotropic etching of an insulating layer such as silicon nitride. Deep source/drain contact regions 140 and 150 are then formed by ion implantation of Arsenic or Phosphorus and thermal annealing to activate the dopants. Device fabrication is completed with standard passivation, contact and metallization processes. While not explicitly shown, it is apparent, because only conventional processing is required, that other CMOS devices can be formed in the same mask with the present NDR device 100, so that, for example, memory and logic circuits can be formed at the same time as the present device, and thus integrated directly to form a conventional CMOS circuit having NDR capability. While the above is explained with reference to a CMOS process, it will be appreciated by those skilled in the art that other types of starting semiconductor materials could also be used instead. Suitable and/or optimal processing conditions for achieving the NDR mode in any particular CMOS compatible environment will be easily designed and determined by those skilled in the art through conventional modelling and experimentation techniques.

As a final note it is preferable that during normal operation of device 100 that a body contact ($V_B$) should be electrically biased (e.g. at a fixed potential of 0 Volts, as is typical for n-channel MOSFETs). If body terminal ($V_B$) is not connected (i.e. is "floating") then the NDR behavior is drastically diminished or even eliminated. This is because holes which are generated by hot electrons will accumulate at the channel-to-source junction, forward biasing the junction and effectively reducing the transistor threshold voltage (counteracting the charge-trapping effect of increasing the threshold voltage), if the holes are not allowed to flow out of the channel region through the body contact. Thus, if NDR-MISFET 100 is implemented in a silicon-on-insulator substrate, or in a thin film of polycrystalline silicon, care must be taken to provide a body contact. This aspect of the invention can also be exploited of course for certain applications, where it may be potentially useful to be able to turn on or turn off the NDR mode by connecting or disconnecting (switching) a bias voltage to body terminal $V_B$, respectively.

With the prior art, even if a device exhibiting adequate negative differential resistance can be produced, it is still a daunting task to integrate such a device into a conventional CMOS process. Since the device in this invention is inherently an NMOS structure, integration of this device with conventional logic CMOS devices is straightforward. The illustrative flow in FIG. 4 allows an NDR device process module to be completely decoupled from a conventional process, to allow for independent optimization of the NDR devices and the CMOS devices. This makes it more straightforward to scale the NDR device in this invention with future generations of CMOS integrated-circuit technology.

Additional Processing Variations

Theoretical analyses performed by the inventors indicate that the following conditions and additional process details can be sufficient to achieve an NDR FET in a deep-submicron CMOS technology. In particular, our results show that a peak electric field in the channel on the order of 0.5 MV/cm or higher is preferable. Furthermore, we have also discovered that water ($H_2O$) or Hydrogen can be used to form the aforementioned charge traps, in addition to the other species noted earlier. In a preferred approach, water-related traps are formed by oxidation of heavily boron doped Si followed by a subsequent anneal in a steam ambient. It is believed (but has not been confirmed) that the boron assists in the formation of water-based traps.

In addition, it is further preferable, for at least some geometries, to not use structures that may inhibit the generation of hot carriers in the channel, or significantly reduce the peak electric field. For example, some forms of conventional lightly doped drain (LDD) structures can impede the generation of such carriers, particularly if they are formed prior to the channel doping noted above.

Furthermore, in the discussions above pertaining to the preferred level of p-type dopant concentration in the channel, it will be understood by those skilled in the art that this refers to a "net" p type concentration level, and not the actual absolute value that might be implanted during any particular processing step, or which might be present during any intermediate step. In other words, regardless of the intervening doping operations, the present invention can be implemented in any fashion so long as the final p-type dopant concentration in the channel is on the order of $1 \times 10^{18}$ cm$^{-3}$ or higher, because this permits an appropriate electric field strength to be generated in the channel. In fact, as is apparent from the above, the onset of the NDR behavior can be controlled as well by appropriate tailoring of the channel doping concentration as well. It should be noted that these figures are merely preferable for existing geometries, and that other suitable values will be determinable by those skilled in the art for other geometries, structures, etc., based on the present teachings and other well-known techniques.

In another variation, a preferred embodiment of the present invention can also include a counter-doping step to tailor the NDR FET threshold voltage. This step is performed after the channel doping operation noted earlier, and is simply done to reduce the net p-type concentration in the channel. A higher level of Boron (greater than $5 \times 10^{18}$ cm$^{-3}$) may be desirable for some architectures implemented in deep submicron technologies. Conventional thermal annealing is also preferably employed to help incorporate some of the Boron into the gate dielectric so that it will facilitate the creation of appropriately configured trapping sites.

In yet another variation, although it is preferable in some substrates and applications that the body of the NDR FET be biased (e.g. at 0 V) to minimize the "floating body" effect, it is possible to tailor the design of the NDR FET to ensure that NDR behavior is maintained in the absence of a body bias. Thus, it is possible to implement the NDR FET using a silicon-on-insulator (SOI) substrate, without providing a body contact, for compact integration. Compatibility with SOI substrates is a useful feature, since such substrates will increasingly be used in IC manufacturing to achieve higher circuit operation speeds with lower power consumption, due to significant reductions in interconnect and junction capacitance.

As discussed above, a preferred primary mechanism for achieving NDR behavior in an insulated gate field-effect transistor is to trap energetic ("hot") carriers from a channel. The traps should be configured preferably so that a trap energy level should be higher than the semiconductor conduction band edge, in order for it to primarily (if not exclusively) trap hot carriers. For example, a trap which is energetically located 0.5 eV above the semiconductor conduction band edge can only trap electrons from the semiconductor which have kinetic energy equal to or greater than 0.5 eV. For high-speed NDR FET operation, it is desirable to have the carrier trapping and de-trapping processes occur as quickly as possible. As described in the above preferred embodiment, this result is achieved by placing traps in close proximity to the channel, i.e. within 1.5 nm of the gate-dielectric/semiconductor interface as previously stated.

A similar (if not superior in most cases) result would result if the traps were located right at the interface itself. In this regard it should be noted that interface traps which are energetically located well above the semiconductor conduction band edge will have no effect on FET performance until a significant percentage of the mobile carriers in the channel have sufficient kinetic energy to become trapped. The formation of such interface traps would also be preferable from a process integration standpoint, because it would eliminate the need to selectively form a separate trap-containing dielectric layer in the NDR FET regions of the semiconductor surface. Accordingly, in such instance an appropriate dopant or ion species (of the type mentioned earlier) could be implanted/diffused to position the traps in such interface region instead. The particulars of such implantation and/or diffusion operations will vary from implementation to implementation of course based on the particular geometry, layer compositions, layer thicknesses, desired trap characteristics, desired trap locations, etc., and thus the appropriate process parameters, including ion implantation energies and species will be easily determined through routine optimization by those skilled in the art.

Another apparent observation from the present teachings is the fact that devices employing the present invention utilize a type of tunneling to a charge "trap", and not tunneling to a conduction band per se as required in conventional NDR devices such as tunnel diodes. All that is required is that the carriers be given sufficient energy to penetrate the semiconductor-insulator interface potential barrier, and then be trapped by traps within one or more dielectric layers (including any or all of the $SiO_2$, $SiO_xN_y$ and $Si_3N_4$ layers mentioned above). Thus, it is not necessary to set up a complicated set of precisely tuned layers in a particular fashion to achieve a continuous set of conduction bands as required in conventional NDR devices, and this is another reason why the present invention is expected to achieve more widespread use than competing technologies.

As an additional variation, the NDR FET of the present invention can be used to eliminate the need for p-channel transistors in low-power memory and logic circuits, including for example as a load device or in an inverter. In this regard, the invention provides the capability to implement low-power memory and/or logic functions using an all-NMOS (only n-channel devices) technology. Conventional CMOS technology requires significantly higher process complexity than an all-NMOS technology because of the need to define separate, electrically isolated n-type and p-type well regions, as well as separate n-type and p-type source/drain extension and contact regions. The present invention therefore provides the means to achieve more compact, simpler and overall less expensive circuit architectures and manufacturing processes.

While prior art devices (including memory cells) using single-type transistors are well-known, such devices have typically used either an active or passive load device, including for example a transistor and/or an implanted resistor or thin film resistor. The primary disadvantages of these past approaches are:
1. Significant static power dissipation
2. Reduced output voltage swing (difference between "high" and "low" values of output voltage)

Furthermore, some prior art NDR devices have been proposed as load devices for an SRAM cell (see U.S. Pat. No. 6,294,412 which is incorporated by reference herein) to reduce overall cell size, but these implementations have been limited to two terminal tunneling diodes, which require a specialized sequence of processing steps and hence would increase the complexity and cost of the IC fabrication process.

In contrast, in the present invention, an NDR FET does not require any non-standard processes and only requires that an additional signal line be provided to control a gate of such FET as noted above. Furthermore, since a channel region of the NDR FET uses a dopant common to a conventional insulated gate field effect transistor (IGFET), i.e., such as an n-type channel, these features can be formed at the same time during a manufacturing process.

Accordingly, a very beneficial use of the NDR FET of the present invention would include as a substitute for the NDR load devices of an SRAM memory cell of the type noted in FIGS. 1a and 1b of U.S. Pat. No. 6,294,412 noted earlier. In such an embodiment, structural features critical to the operation of an IGFET shown therein, including for example, a gate insulation layer, source/drain regions, isolation regions, contacts, gate electrodes, etc., formed in a semiconductor die/wafer can all be formed at the same time during common operations and thus shared with an NDR FET of the present invention. From a process integration perspective, the present approach provides a substantial advantage, therefore, over mixed process load technologies.

Additional Embodiments

Figure 5:
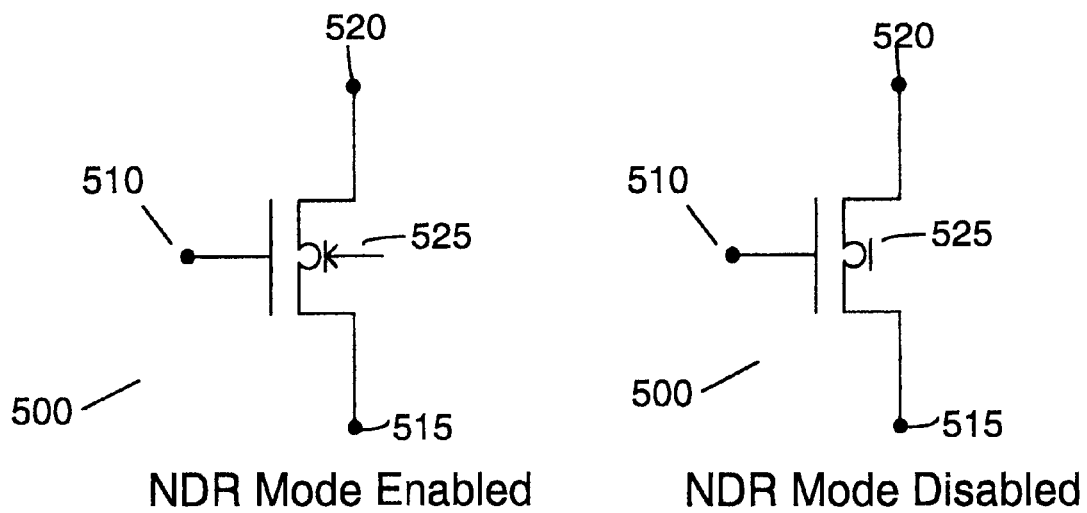
FIG. 5 shows two new electronic circuit symbols for designating the presence of a multi-mode NDR FET that is operable in either an NDR enabled or NDR disabled mode respectively.

FIG. 5 shows two new electronic circuit symbols for denoting the state or operational mode of an NDR FET 500 of the present invention as set by an NDR mode control signal applied to body terminal 525. The first symbol is used herein for indicating that the NDR FET is operating with an NDR characteristic enabled (i.e., by setting body terminal to a particular voltage state such as a low voltage state) while the second is used for indicating that the NDR FET is operating without an NDR effect—i.e., as a regular semiconductor FET (i.e. by appropriate biasing of body terminal 525, such as by floating it, or even setting the input signal to a floating condition). This ability to switch the state of the present device dynamically between an NDR mode and a non-NDR mode provides additional operational flexibility that is not achievable with any prior art device known to the present inventors. To date, in fact, NDR devices have been specially constructed from particular materials and with biasing specifically adopted and fixed to provide only an NDR mode of operation under appropriate operating parameters.

The value of the NDR mode control signal can be set and changed dynamically as needed through conventional and well-known means by a mode select circuit (not shown) depending on the desired functionality of NDR FET 500. The value of NDR mode control signal can be fixed during manufacturing to a particular non-changeable state (i.e., by tieing the signal low for example), or it can be set by reference to a programmable memory table, etc. Through such mechanism the present invention effectuates a new type of integrated device that can simultaneously provide two different forms of switching control, and further enable larger scale logic circuits to simultaneously perform multiple logic functions. In an array or block of NDR FETs of the present invention, each individual NDR FET could of course receive the same signal as every other NDR FET, or alternatively a unique NDR mode control signal could be used to achieve control on a device level. In this way, different types of logic functions could be selectively implemented through intelligent and efficient arrangements, configurations and control of individual multi-mode NDR gates.

Figure 5A:
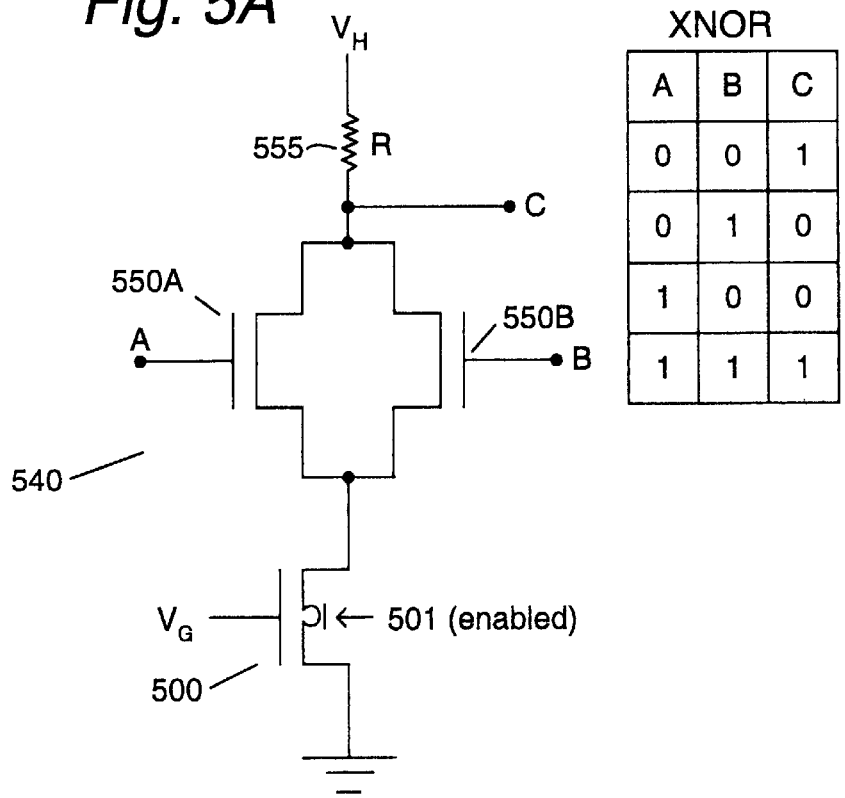
FIGS. 5A and 5B illustrates one embodiment of a multi-mode logic circuit that includes a multi-mode FET that operates with both an NDR mode and a non-NDR mode depending on the value of an NDR control signal, so that a single logic circuit functions either as an XNOR gate or as an NOR gate, depending on the value of the NDR control signal.
Figure 5B:
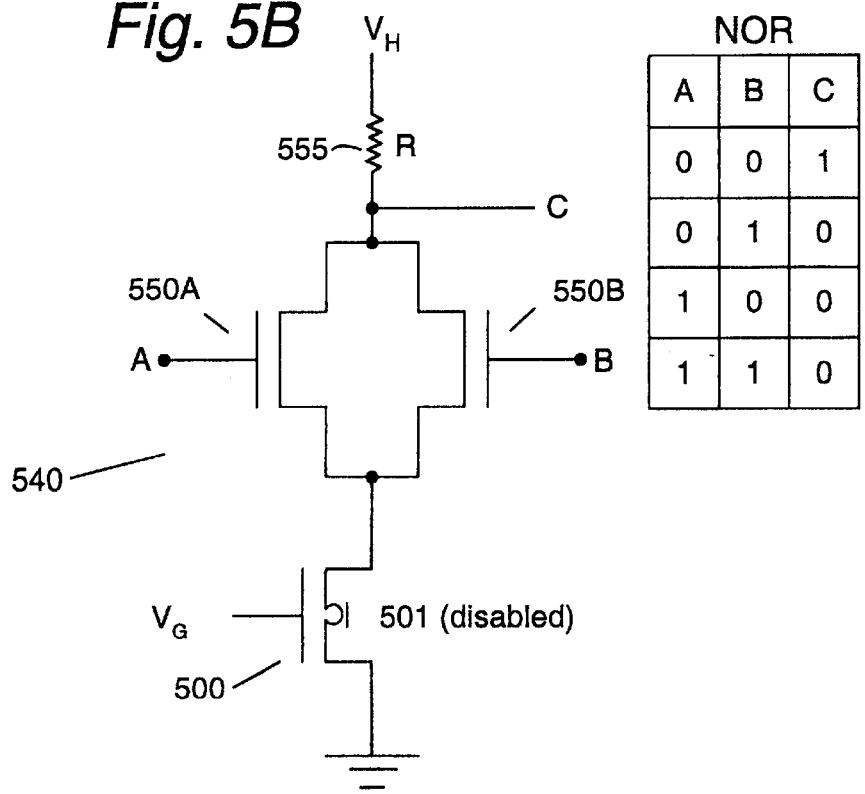

FIGS. 5A and 5B illustrate a structure and operation of a first embodiment of a simple multi-mode logic circuit 540 that includes a multi-mode NDR FET 500 that operates with both an NDR mode and a non-NDR mode depending on the value of an NDR control signal 501. As explained below, this multi-mode logic circuit 540 in fact simultaneously provides functionality so that at any moment in time, either of two different boolean operations can be effectuated on a set of data inputs. This is done by setting the state of the NDR control signal, so that logic circuit 540 functions either as an XNOR gate or as an NOR gate as seen in FIG. 5B. Multi-mode logic circuit 540 further includes two separate conventional semiconductor elements in the form of input FETs 550A and 550B for receiving two logical inputs A and B respectively, and a load resistor R 555 (which also of course can be implemented in FET form).

In the simplest case, when NDR FET 500 is not set to an NDR mode by NDR control signal 501 as seen in FIG. 5B, the operation of logic circuit 540 can be seen to be simply that of an NOR gate. In other words, if either or both of FETs 550A/550B are turned on, and $V_G$ is also set high, then output C will be pulled to ground, representing a logical 0. Only if both FETs are off 550A/550B will output C be pulled high to $V_H$, as depicted in the logic table set out in FIG. 5B.

Conversely, when NDR FET 500 is set to an NDR mode by NDR control signal 501, the operation of logic circuit 540 can be seen to be that of an XNOR gate. As before, when both FETs 550A/550B are off, output C be pulled high to $V_H$. When only one of FETs 550A/550B are turned on, and $V_G$ is also set high, then output C will be pulled to ground, representing a logical 0. However, in the case where both FETs 550A/550B are turned on, the peak current of NDR FET 500 is exceeded so that it is caused to operate in an NDR region, again, shutting itself off. Thus, there is no path to ground, and output C is pulled high again. Consequently, two different boolean operations can be performed by the same elements within a single logic circuit, and the selection of which one is used can be controlled selectively as needed at any moment in time for a particular set of inputs.

Figure 5C:
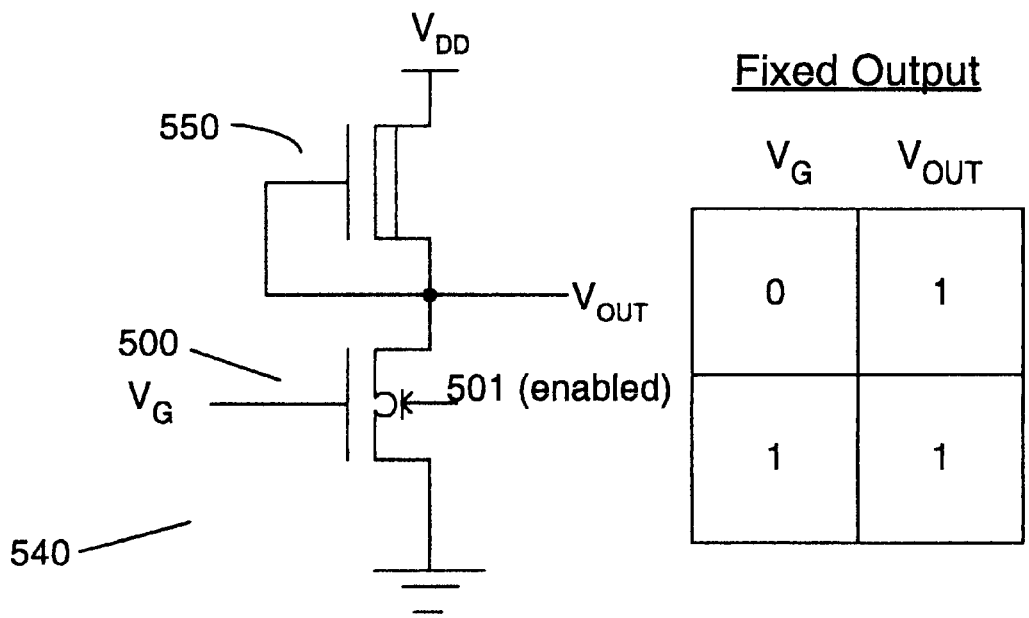
FIGS. 5C and 5D illustrate a second embodiment of a multi-mode logic circuit that includes a multi-mode FET that operates with both an NDR mode and a non-NDR mode depending on the value of an NDR control signal, so that a single logic circuit functions either as a fixed output or as an inverter, depending on the value of the NDR control signal.

FIG. 5C illustrates a second embodiment of a multi-mode logic circuit 540 that includes a first multi-mode FET 500 and a regular FET 505; the former as above operates with both an NDR mode and a non-NDR mode depending on the value of an NDR control signal 501. As explained below, this multi-mode logic circuit 540 in fact simultaneously provides functionality so that either of two different circuit functions can be effectuated on a single data input. In fact, a single logic circuit 540 of this type with only two active elements functions either as a fixed output (FIG. 5C) or as an inverter (as seen in FIG. SD) depending on the value of the NDR control signals 501.

Figure 5D:
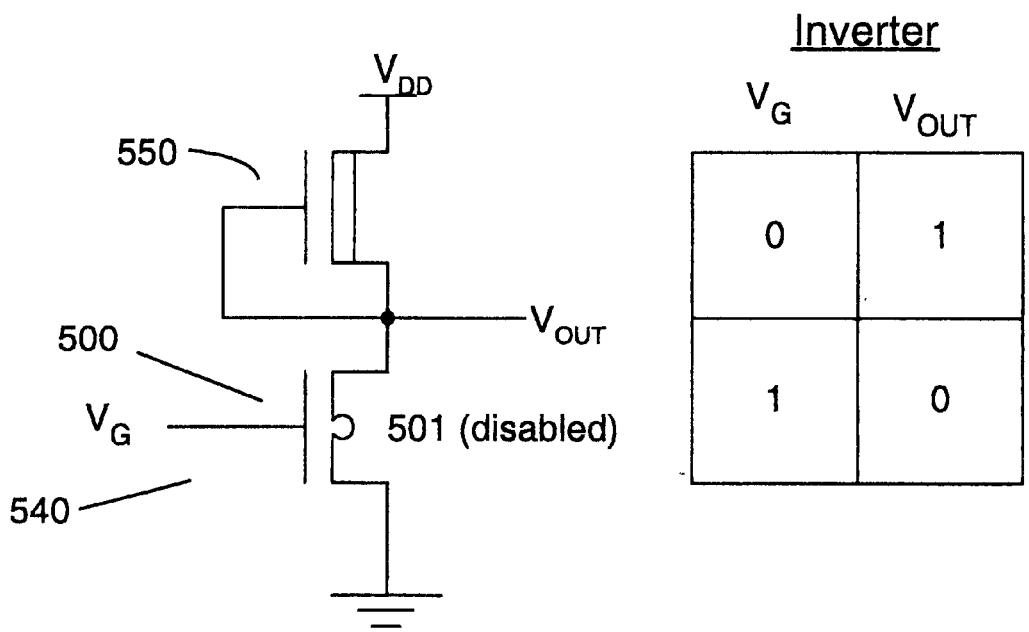

Looking first at the case of FIG. 5D where the NDR FET is set to a non-NDR mode, this circuit behaves like a conventional inverter. In other words, when $V_G$ is high FET 500 turns on so that output $V_{out}$ is pulled low, and when $V_G$ is low FET 500 is turned off so that $V_{out}$ is high.

Alternatively, as seen in FIG. 5C, in the case where NDR FET 500 is selectively set to an NDR mode by an NDR control signal, the operation of logic circuit 540 can be seen to be that of a fixed output. For a logical "0" input on $V_G$, output $V_{out}$ is high. For a logical "1" voltage level for $V_G$ device 500 operates in an NDR region. The NDR effect also prevents device 500 from conducting any current, thus rendering $V_{out}$ high again. It can be seen that through appropriate selection/biasing of FET 550 that the opposite effect could be achieved, i.e., to achieve a fixed low output instead of a fixed high output.

This particular type of circuit could be used, for example, as a secondary mode of operation during startup or testing modes of a device incorporating the same. For example, the fixed data value might be used as a "reset" type signal for a subsequent logic stage, or as a type of factory-adjustable device memory for storing pertinent device information without using a conventional non-volatile memory. For instance, a configuration register for a particular device might include values that are provided (at least in part) by such programmed values from FETs that the circuit designer has specifically implemented in lieu of using a conventional FET for a latch circuit. Thus, by exploiting the dual capabilities of NDR FET 500 additional functionality can be provided without using an additional configuration memory. The value for data signal $V_{out}$ is also non-volatile in the sense that it is inherent in the characteristics of the present device, and does not require any additional power supply or logic to ascertain such value. Accordingly, configuration information can be provided advantageously at the manufacturing level without the need for additional circuitry simply by using circuitry that is already present in a device for other required logic operations.

It will be understood by those skilled in the art that the particular circuit implementation for multi-mode logic circuit 540 in the above embodiments, including the relative sizings of the various FETs and load resistor R, the input bias voltage settings for the body terminal needed to create the NDR effect, the range of inputs for logic values A and B etc., will vary from implementation to implementation and in accordance with the particular design requirements for the system in which multi-mode logic circuit 540 is incorporated. These particular circuit parameters are not material to the teachings of the present invention, and can be configured and implemented by those skilled in the art using routine and well-known design techniques.

Again, as noted above, one of the significant advantages of the present technique is that the various NDR semiconductor structures can be fabricated using solely (or at least primarily) conventional semiconductor processing procedures. While a preferred implementation is shown in terms of a structure that is substantially that of an FET with active areas and a channel located in a silicon substrate, the invention is not limited to such physical implementation. Any structural arrangement or physical manifestation of the NDR structure that permits control of the type of NDR capable channel described above should yield satisfactory results within the teachings herein.

It will be further appreciated that other similar combinations and arrangements for multi-mode circuits will be apparent from the present teachings, and the present invention is by no means restricted to any particular circuit type or implementation. In addition, larger combinations of conventional FETs and NDR FETs can be configured and interconnected using the present teachings and well-known circuit techniques to provide larger logic functions on larger data values—i.e., on a byte or word basis as needed, so that the present invention can be incorporated within conventional processing logic.

The integration efficiency of the present invention essentially provides a new type of semiconductor logic family with superior operation/element count metrics. For example, in the first embodiment of FIG. 5A, two different boolean logic operations are provided by three or at most four semiconductor elements (two conventional FETs, an NDR FET and a load device). Looking at it from another perspective, the present invention yields logic circuits that have a function/element ratio greater than ½ and approaching 1 (two thirds or ¾, depending on whether the load resistor is also implemented as a FET). The achievable logic functions per element or gate is an important benchmark in semiconductor design, and the present invention thus achieves a value that is far superior to anything known to the applicants in the area of CMOS compatible logic. Furthermore, since the present invention is embodied as part of a FET, it represents a fundamental building block usable in any conventional design; i.e., it is integrated as part of the smallest single active element manufacturable with a given processing/lithographic generation of technology.

It will be apparent to those skilled in the art the aforementioned NDR device can be advantageously employed in both memory and logic applications, and in the types of circuits as described in the prior art, i.e., as a memory device, as part of a logic circuit, a self-latching logic device, an amplifier, an oscillator, power management, and many other environments where its useful characteristics can be exploited.

While this invention has been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is therefore intended that the appended claims encompass any such modifications or embodiments. While such claims have been formulated based on the particular embodiments described herein, it should be apparent the scope of the disclosure herein also applies to any novel and non-obvious feature (or combination thereof) disclosed explicitly or implicitly to one of skill in the art, regardless of whether such relates to the claims as provided below, and whether or not it solves and/or mitigates all of the same technical problems described above. Finally, the applicants further reserve the right to pursue new and/or additional claims directed to any such novel and non-obvious features during the prosecution of the present application (and/or any related applications).

What is claimed is:

1. A method of operating an electronic device comprising the steps of:
    (a) operating a semiconductor structure in a first mode characterized by a negative differential resistance characteristic in at least one operating region of the structure; and
    (b) operating said semiconductor structure in a second mode characterized by a non-negative differential resistance characteristic in said at least one operating region; and
    (c) coupling a region of said semiconductor structure to a mode selection signal; and
    (d) selecting whether said first mode or said second mode is enabled for said semiconductor structure using said mode selection signal.

2. The method of claim 1, wherein said mode selection signal is set to a fixed voltage potential value.

3. The method of claim 2, wherein said fixed voltage potential value is coupled to a ground potential.

4. The method of claim 1, further including a step: selecting said first mode or said second mode in response to a logic function to be performed by the electronic device.

5. The method of claim 1, wherein said semiconductor structure is a silicon based negative differential resistance capable field effect transistor (FET).

6. A method of operating a silicon based negative differential resistance (NDR) capable device comprising the steps of:
    selectively operating a silicon based NDR field effect transistor (FET) in either an NDR mode or a non-NDR mode;
    wherein in said negative differential resistance mode the silicon based dual mode NDR FET includes at least one operating region in which it exhibits negative differential resistance, and in said non-negative differential resistance mode the silicon based dual mode NDR FET does not exhibit negative differential resistance in any operating region; and
    providing a mode selection voltage potential which in a first state causes said silicon based NDR FET to operate in an NDR mode, and which in a second state causes said silicon based NDR FET to operate in a non-NDR mode;
    wherein said mode selection voltage potential is applied to a semiconductor region coupled to the silicon based NDR FET.

7. The method of claim 6, wherein said semiconductor region is a body region of said silicon based dual mode NDR FET, and said mode selection voltage potential is a ground voltage potential.

8. The method of claim 6, wherein said mode selection voltage potential is set to said first state and/or said second state in response to a logic function to be performed using said silicon based dual mode NDR FET.

9. The method of claim 6, wherein said mode selection voltage potential is generated in response to a value set in a programmable memory table for the silicon based dual mode NDR FET.

10. The method of claim 6, further including steps of: performing a first logic function using said silicon based dual mode NDR FET at a first time in response to said mode selection voltage potential being in said first state, and performing a second logic function using said silicon based dual mode NDR FET at a second time in response to said mode selection voltage potential being in said second state.

11. The method of claim 6, furthering including a step of effectuating said negative differential resistance mode at least in part by temporary trapping and de-trapping of charge from a channel of said silicon based dual mode NDR FET.

12. The method of claim 6, further including a step of interconnecting and coupling the silicon based NDR field effect transistor (FET) to a non-NDR FET within a common silicon substrate to form a logic circuit comprised of both NDR and non-NDR elements.

13. A method of operating a multi-mode electronic circuit comprising the steps of:

selectively operating at least one first type semiconductor structure with a negative differential resistance mode; and receiving a mode selection value, said mode selection value determining whether said negative differential resistance mode is enabled or disabled; and coupling said at least one first type semiconductor structure to a second type semiconductor structure, said second type semiconductor structure operating only in a non-negative differential resistance mode;

wherein said at least one first type semiconductor structure and said second type semiconductor structure are interconnected and operate as part of a single multi-mode electronic circuit.

14. The method of claim 13, wherein said first type semiconductor structure is substantially that of a field effect transistor (FET).

15. The method of claim 14, wherein said second type semiconductor structure is also substantially that of a FET.

16. The method of claim 13, wherein the multi-mode electronic circuit performs a first circuit function on one or more input signals when said negative differential resistance mode is enabled, and the multi-mode electronic circuit performs a second circuit function on said one or more input signals when said negative differential resistance mode is disabled.

17. The method of claim 16, wherein said first circuit function is that of an inverter.

18. The method of claim 17, wherein said second circuit function is that of a fixed logic state output.

19. The method of claim 13 wherein the multi-mode electronic circuit performs a first boolean operation on one or more input signals when said negative differential resistance mode is enabled, and the multi-mode electronic circuit performs a second boolean operation on said one or more input signals when said negative differential resistance mode is disabled.

20. The method of claim 19 wherein said first Boolean operation is an XNOR function.

21. The method of claim 20 wherein said second Boolean operation is a NOR function.

22. The method of claim 13, further including a step of coupling said mode selection value to a fixed reference potential to enable said NDR mode.

23. The method of claim 13, further including a step of coupling said mode selection value to a floating reference potential to disable said NDR mode.

* * * * *